US010978510B2

(12) United States Patent
Li et al.

(10) Patent No.: US 10,978,510 B2
(45) Date of Patent: Apr. 13, 2021

(54) MEMORY DEVICE WITH DENSITY-CONTROLLABLE DUMMY FILL STRATEGY FOR NEAR-MRAM PERIPHERY AND FAR-OUTSIDE-MRAM LOGIC REGIONS FOR EMBEDDED MRAM TECHNOLOGY

(71) Applicant: GLOBALFOUNDRIES Singapore Pte. Ltd., Singapore (SG)

(72) Inventors: Pinghui Li, Singapore (SG); Haiqing Zhou, Singapore (SG); Liying Zhang, Singapore (SG); Wanbing Yi, Singapore (SG); Ming Zhu, Singapore (SG); Danny Pak-Chum Shum, Singapore (SG); Darin Chan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 65 days.

(21) Appl. No.: 16/443,255

(22) Filed: Jun. 17, 2019

(65) Prior Publication Data
US 2019/0305041 A1 Oct. 3, 2019

Related U.S. Application Data

(62) Division of application No. 15/858,655, filed on Dec. 29, 2017, now Pat. No. 10,374,005.

(51) Int. Cl.
| | |
|---|---|
| *H01L 27/22* | (2006.01) |
| *H01L 43/02* | (2006.01) |
| *H01L 43/08* | (2006.01) |
| *G11C 5/02* | (2006.01) |
| *G11C 11/16* | (2006.01) |

(Continued)

(52) U.S. Cl.
CPC ............ *H01L 27/222* (2013.01); *G11C 5/025* (2013.01); *G11C 11/15* (2013.01); *G11C 11/161* (2013.01);
(Continued)

(58) Field of Classification Search
CPC ........... H01L 27/222–228; H01L 43/02; H01L 43/08; H01L 43/10; H01L 43/12;
(Continued)

(56) References Cited

U.S. PATENT DOCUMENTS 6,466,475 B1 * 10/2002 Nickel ................... G11C 11/15
365/158
8,772,051 B1 7/2014 Zhong et al.
(Continued)

*Primary Examiner* — Younes Boulghassoul
(74) *Attorney, Agent, or Firm* — Ditthavong, Steiner & Mlotkowski

(57) ABSTRACT

Methods of forming a MTJ dummy fill gradient across near-active-MRAM-cell periphery and far-outside-MRAM logic regions and the resulting device are provided. Embodiments include providing an embedded MRAM layout with near-active-MRAM-cell periphery logic and far-outside-MRAM logic regions; forming a MTJ structure within the layout based on minimum space and distance rules relative to a first metal layer, a second metal layer, and/or both the first and second metal layers; forming a high-density MTJ dummy structure in the near-active-MRAM-cell periphery logic region based on second minimum space and distance rules relative to a first metal layer, a second metal layer, and/or both the first metal layer and the second metal layer; and forming a low-density MTJ dummy structure in the far-outside-MRAM logic region based on third minimum space and distance rules relative to a first metal layer, a second metal layer, and/or both the first metal layer and the second metal layer.

19 Claims, 13 Drawing Sheets

(51) Int. Cl.
    *H01L 27/02*     (2006.01)
    *H01L 43/12*     (2006.01)
    *G11C 11/15*     (2006.01)

(52) U.S. Cl.
    CPC .............. *H01L 43/02* (2013.01); *H01L 43/08* (2013.01); *H01L 43/12* (2013.01); *H01L 27/0207* (2013.01)

(58) Field of Classification Search
    CPC ....... H01L 27/0207; G11C 11/14–1697; G11C 5/025; H01F 10/324–3295
    See application file for complete search history.

(56) References Cited

U.S. PATENT DOCUMENTS

| Patent/Pub No. | Date | Inventor | Class |
|---|---|---|---|
| 9,142,762 B1 | 9/2015 | Li et al. | |
| 2010/0289098 A1 | 11/2010 | Li et al. | |
| 2012/0193601 A1* | 8/2012 | Tsukamoto | G11C 11/16 257/5 |
| 2013/0119494 A1 | 5/2013 | Li et al. | |
| 2013/0343113 A1* | 12/2013 | Matsuda | G11C 11/1659 365/69 |
| 2014/0264679 A1 | 9/2014 | Lee et al. | |
| 2015/0171314 A1 | 6/2015 | Li et al. | |
| 2015/0325622 A1 | 11/2015 | Zhang et al. | |
| 2016/0133828 A1* | 5/2016 | Lu | H01L 43/12 257/421 |
| 2016/0268336 A1 | 9/2016 | Shum et al. | |
| 2016/0365505 A1 | 12/2016 | Lu et al. | |
| 2017/0047374 A1 | 2/2017 | Lu et al. | |
| 2017/0092693 A1 | 3/2017 | Tan et al. | |
| 2017/0104029 A1* | 4/2017 | Li | G11C 11/161 |
| 2018/0301505 A1 | 10/2018 | Chuang et al. | |
| 2018/0309051 A1 | 10/2018 | Deshpande et al. | |

\* cited by examiner

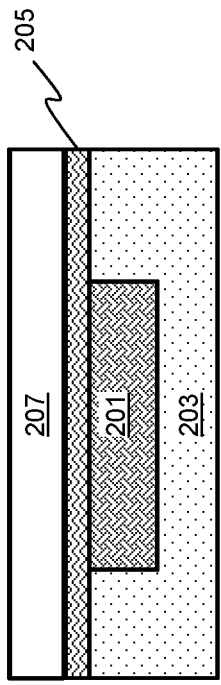
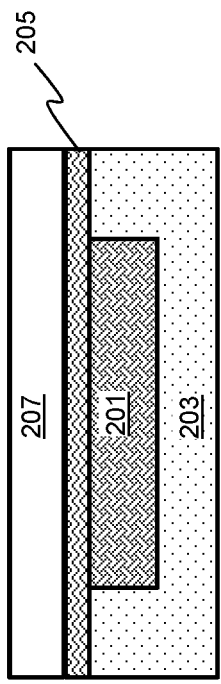
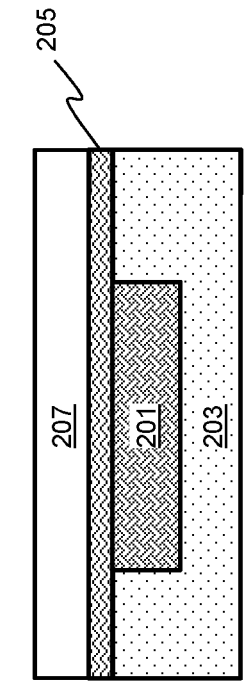
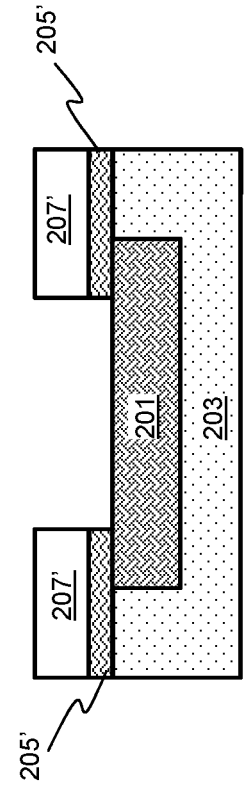

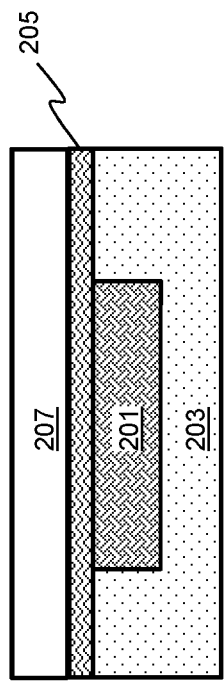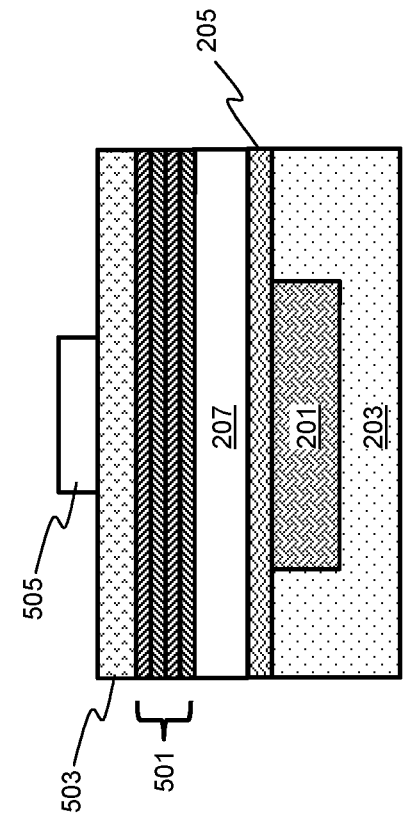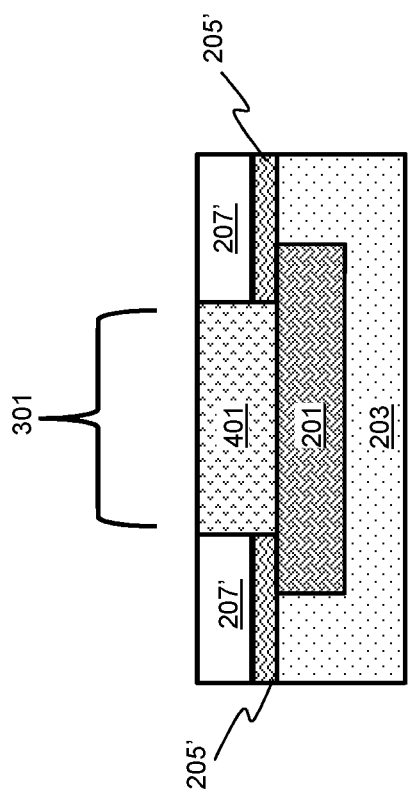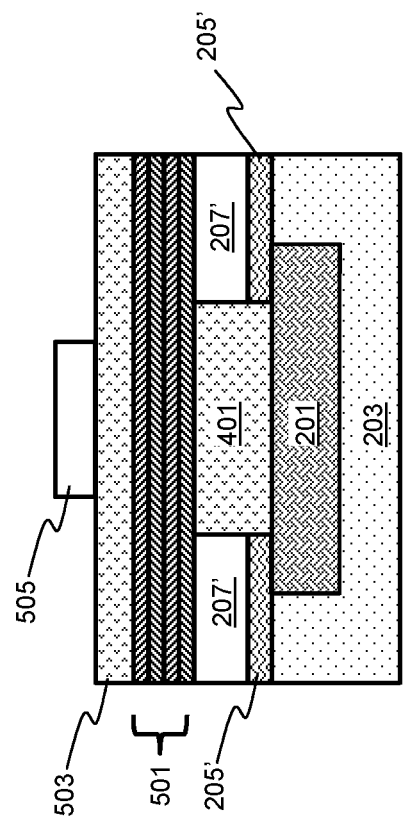

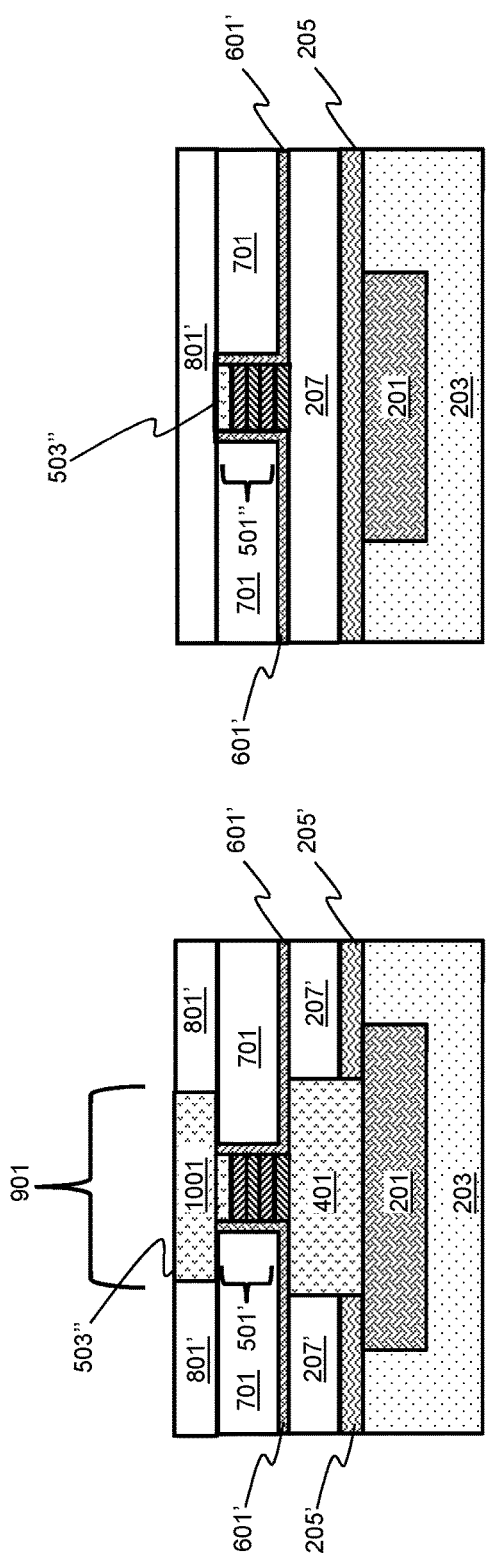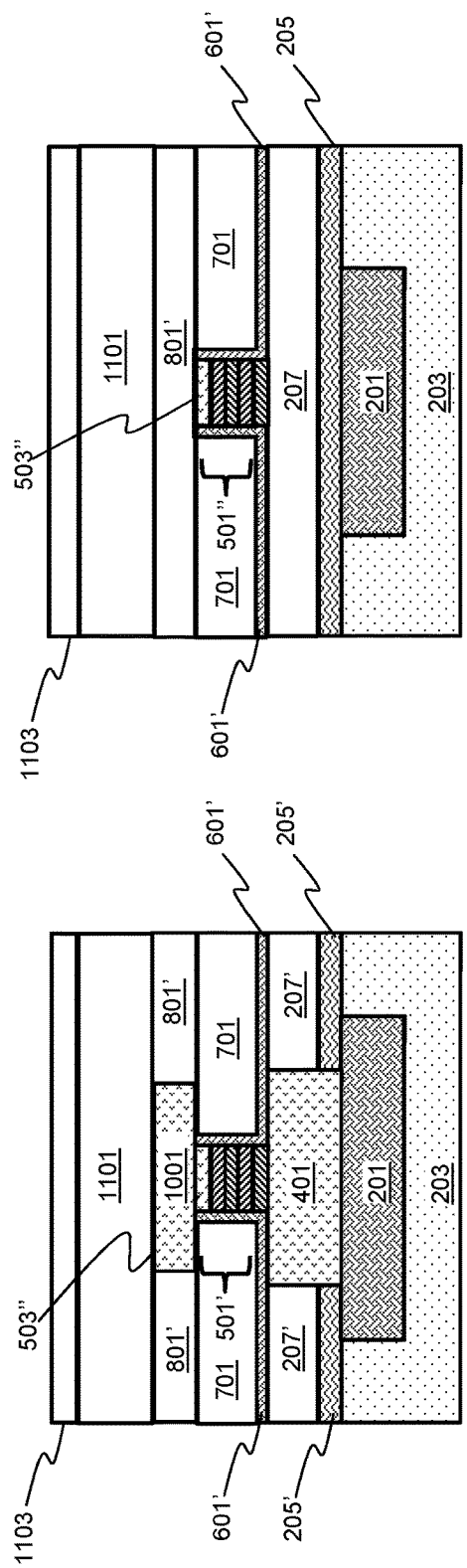

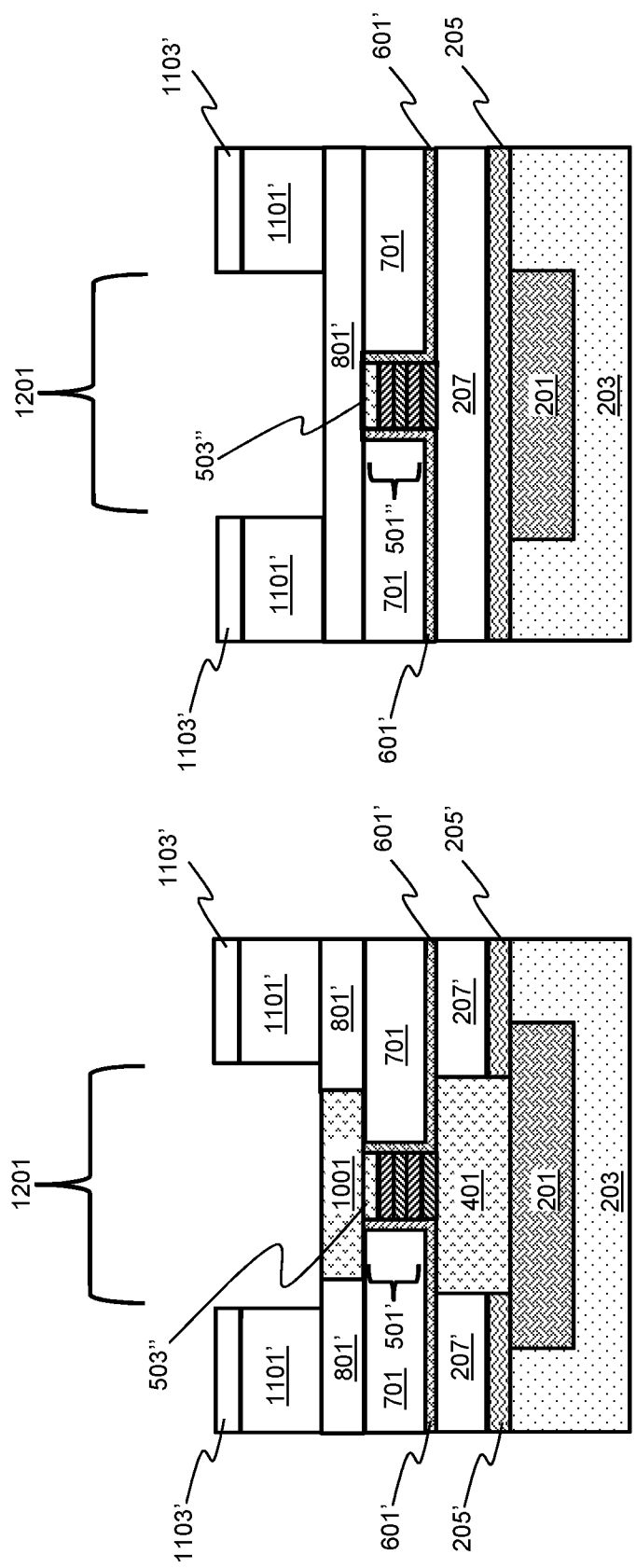

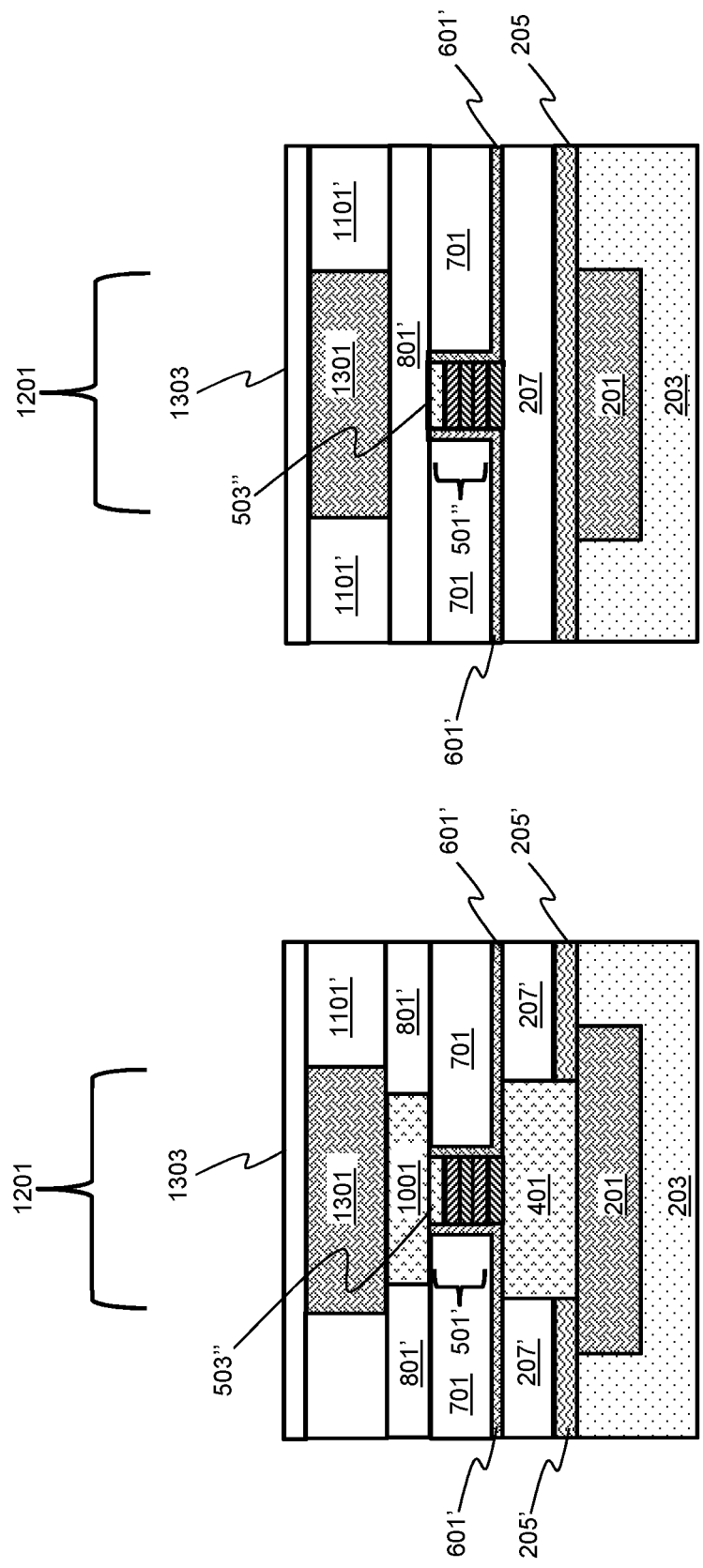

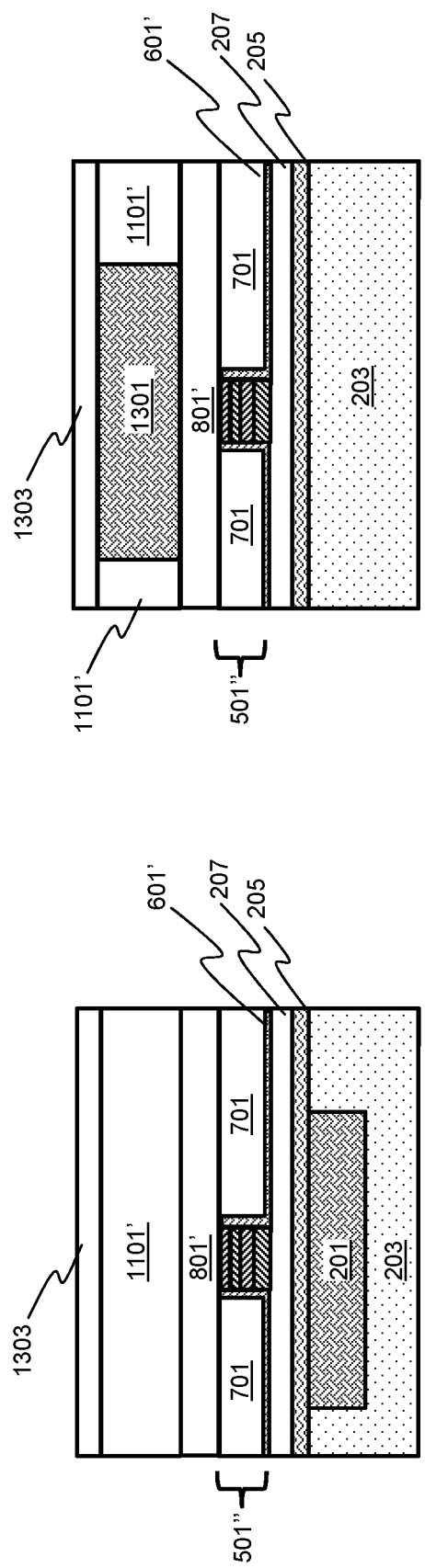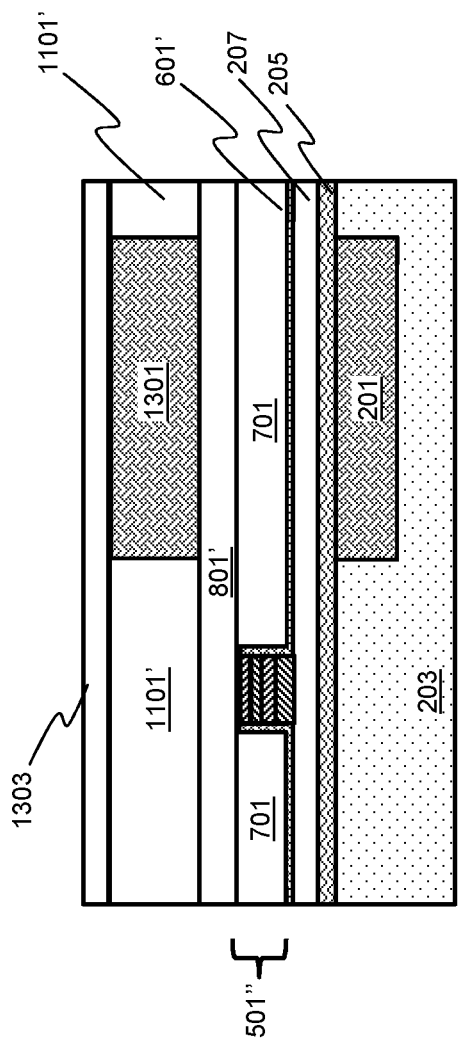
FIG. 14A
FIG. 14B
FIG. 14C

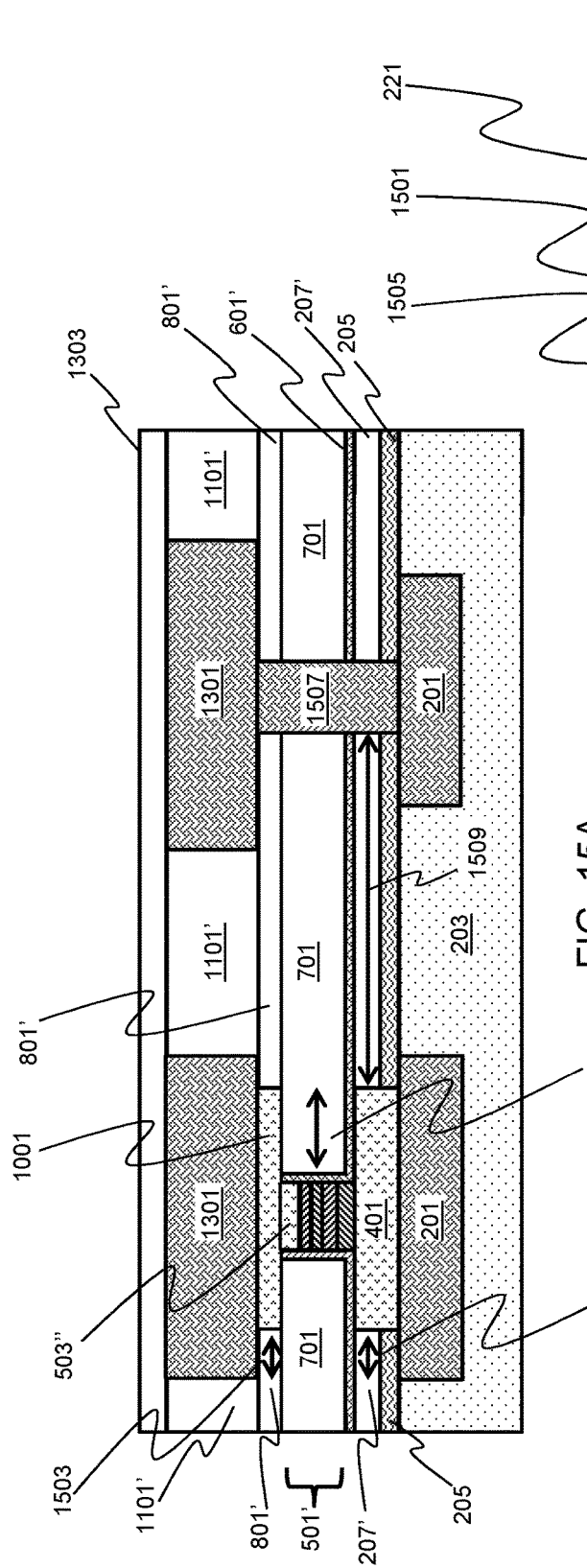
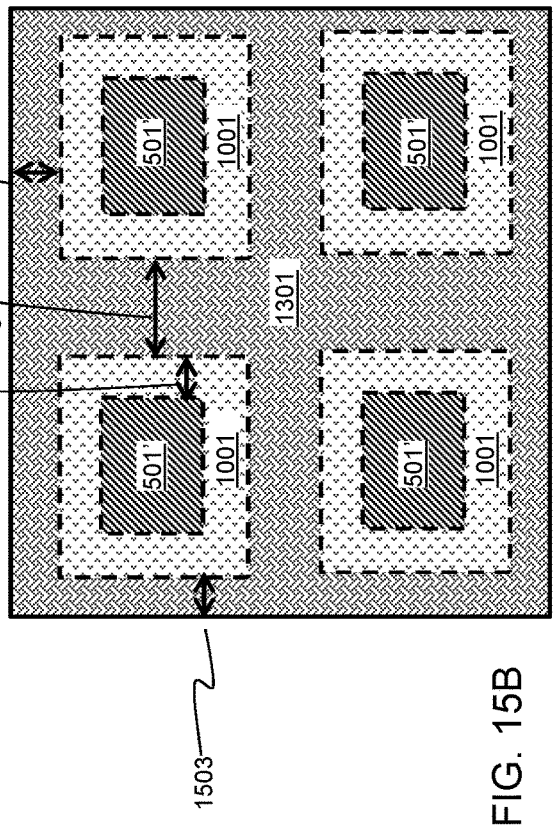
FIG. 15A
FIG. 15B

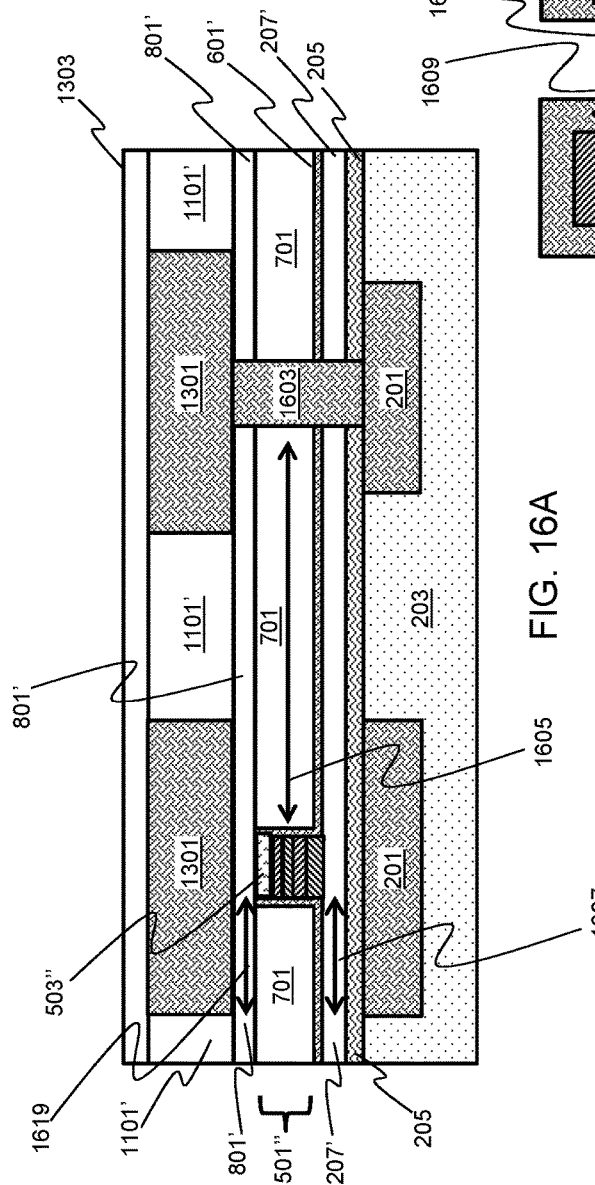
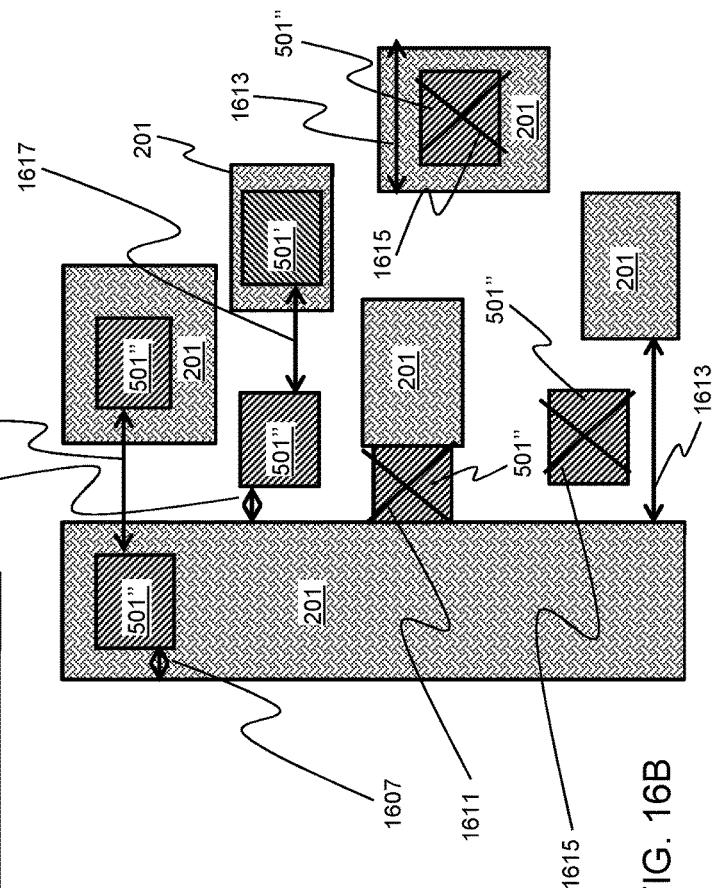
FIG. 16A
FIG. 16B

MEMORY DEVICE WITH DENSITY-CONTROLLABLE DUMMY FILL STRATEGY FOR NEAR-MRAM PERIPHERY AND FAR-OUTSIDE-MRAM LOGIC REGIONS FOR EMBEDDED MRAM TECHNOLOGY

RELATED APPLICATIONS

The present application is a Divisional application of application Ser. No. 15/858,655, filed on Dec. 29, 2017, which is incorporated herein by reference in their entirety.

TECHNICAL FIELD

The present disclosure relates to semiconductor fabrication. In particular, the present disclosure relates to the formation of magnetoresistive random-access memory (MRAM) devices.

BACKGROUND

A known solution to producing a uniform magnetic environment in connection with MRAM devices includes placing dummy magnetic cells at the perimeter of the memory array; however, the non-active dummy magnetic cells increase the overall MRAM cell dimensions, which wastes valuable MRAM cell space and is not suitable for embedded MRAM cell technology. Another known solution includes a standard via dummy fill solution, wherein dummy fill is generated within the common (overlapping) regions of top and below metal dummy regions. However, this solution does not meet the metal tunnel junction (MTJ) density requirement for MRAM design, especially inside the near-active-MRAM-cell (MRAM cell plus 10 micrometer (μm)) periphery logic regions.

A need therefore exists for methodology enabling a MRAM cell layout that meets MTJ density requirements for embedded MRAM cell technology without increasing the overall MRAM cell dimensions and the resulting device.

SUMMARY

An aspect of the present disclosure is a method of forming different density MTJ dummy fill in near-active-MRAM-cell periphery and far-outside-MRAM logic regions to produce a MTJ dummy fill gradient decreasing in density from an MRAM cell towards the outer logic regions.

Another aspect of the present disclosure is a device including a MTJ dummy fill gradient that decreases in density from a MRAM cell to the outer logic regions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing an embedded MRAM layout with a near-active-MRAM-cell periphery logic region and a far-outside-MRAM logic region; forming a MTJ structure within the layout based on first minimum space and distance rules relative to a first metal layer, a second metal layer, and/or both the first metal layer and the second metal layer; forming a high-density MTJ dummy structure in the near-active-MRAM-cell periphery logic region without a top electrode or a bottom electrode based on second minimum space and distance rules relative to a first metal layer, a second metal layer, and/or both the first metal layer and the second metal layer; and forming a low-density MTJ dummy structure in the far-outside-MRAM logic region without a top electrode or a bottom electrode based on third minimum space and distance rules relative to a first metal layer, a second metal layer, and/or both the first metal layer and the second metal layer.

Aspects of the present disclosure include forming the MTJ structure based on a distance away from back-end-of-line (BEOL) capacitance (VNCAP) and inductor (IND) regions within the layout and a distance away from C4 bumping (LV)/wirebond (DV) regions of the layout. Other aspects include forming the MTJ structure by: forming a bottom electrode over a first metal layer; forming a MTJ stack over a portion of the bottom electrode; forming a top electrode over the MTJ stack; and forming a second metal layer over the top electrode. Further aspects include the first minimum space and distance rules including: (1) a distance between proximate top electrodes and bottom electrodes, respectively; (2) a distance between outer edges of the bottom electrode and the top electrode and respective outer edges of a first metal layer and a second metal layer; (3) a distance between outer edges of a MTJ stack and respective outer edges of the top electrode and the bottom electrode; and (4) a distance between a top electrode and a bottom electrode and a metal interconnect of a first metal layer and a second metal layer. Another aspect includes forming the high-density MTJ dummy structure and the low-density MTJ dummy structure by: forming a second MTJ stack: (1) over a first metal layer; (2) under a second metal layer; (3) over a first metal layer and under a second metal layer; and/or (4) between and proximate a first metal layer and a second metal layer, wherein the second MTJ stack is formed to a width and a length greater than or equal to 0.11 μm.

Other aspects include the second minimum space and distance rules and the third minimum space and distance rules each including: (1) a distance between two of the second MTJ stacks proximate to each other; (2) a distance between the second MTJ stack and a metal interconnect of a first metal layer and a second metal layer; (3) a distance between outer edges of the second MTJ stack and respective outer edges of the first metal layer; (4) a distance between the second MTJ stack and the first metal layer; (5) a prohibition against the second MTJ stack interacting with two or more of the first metal layers having different electrical potential; (6) a distance between two of the first metal layers each with a different electrical potential proximate to each other; (7) a distance between a MTJ stack of the MTJ structure and the second MTJ stack; (8) a distance between outer edges of the second MTJ stack and respective outer edges of the second metal layer; (9) a distance between the second MTJ stack and the second metal layer; (10) a distance between two of the second metal layers each with a different electrical potential proximate to each other; (11) a distance between the second MTJ stack and both a second metal layer of a first electrical potential and a second metal layer of a second opposite electrical potential; and (12) a distance between the second MTJ and an edge of the first metal layer and the second metal layer, wherein the first metal layer and the second metal layer are overlapping and first metal layer and the second metal layer have a different electrical potential. Further aspects include the distance of the second minimum space and distance rules and the distance of third minimum space and distance rules being potentially different and the distance of the second minimum space rules being potentially less than the distance of the third minimum space and distance rules.

Another aspect of the present disclosure is a device including: an ultra-low k (ULK) layer with a near-active-MRAM-cell periphery logic region and a far-outside-MRAM logic regions; a first metal layer within portions of the ULK layer; a first capping layer over a portion of the ULK layer and a portion of the first metal layer; a first low-k hydrogenated oxidized silicon carbon (LK SiCOH) layer over the first capping layer; a MTJ structure over a first metal layer; a high-density MJT dummy structure without a top electrode or a bottom electrode over the first LK SiCOH layer in the near-active-MRAM-cell periphery logic region; a low-density MTJ dummy structure without a top electrode or a bottom electrode over the first LK SiCOH layer in the far-outside-MRAM logic region; a second LK SiCOH layer over a portion of the ULK layer; a second metal layer within portions of the second LK SiCOH layer; and a second capping layer over the ULK layer, wherein a location of each of the MTJ structure, the high-density MTJ dummy structure, and the low-density MTJ dummy structure is based on first minimum space and distance rules, second minimum space and distance rules, and third minimum space and distance rules, respectively, relative to the first metal layer, the second metal layer, and/or both the first metal layer and the second metal layer.

Aspects of the device include BEOL VNCAP and IND regions; and LV/DV regions, wherein the MTJ structure is located a distance away from the VNCAP and IND regions and a distance away from the LV/DV regions. Other aspects include a bottom electrode having a width and a length of 0.15 µm over a first metal layer; a MTJ stack having a width and a length of 0.12 µm over a portion of the bottom electrode; a top electrode having a width and a length of 0.15 µm over the MTJ stack; and a second metal layer over the top electrode, wherein the MTJ structure comprises the bottom electrode, the MTJ stack, and the top electrode. Further aspects include the first minimum space and distance rules including: (1) a distance between two of the top electrodes and two of the bottom electrodes proximate to each other, respectively; (2) a distance between outer edges of the bottom electrode and the top electrode and respective outer edges of the first metal layer and the second metal layer; (3) a distance between outer edges of the MTJ stack and respective outer edges of the top electrode and the bottom electrode; and (4) a distance between the top electrode and the bottom electrode and a metal interconnect of a first metal layer and a second metal layer. Additional aspects include a third capping layer over a remaining portion of the first metal layer; a third LK SiCOH layer over the third capping layer; a second MTJ stack: (1) over a first metal layer; (2) under a second metal layer; (3) over a first metal layer and under a second metal layer; and/or (4) between and proximate a first metal layer and a second metal layer; and a fourth LK SiCOH layer over a remaining portion of the ULK layer, wherein the high-density MTJ dummy structure and the low-density MTJ dummy structure comprise the second MTJ stack. Another aspect includes a third metal layer over the MTJ structure, the high-density MTJ dummy structure, and the low-density MTJ dummy structure; and an encapsulation layer over the first LK SiCOH layer, a portion of the bottom electrode, and along sidewalls of the MTJ stack, the second MTJ stack, and the third metal layer, respectively.

Other aspects include the second minimum space and distance rules and the third minimum space and distance rules each including: (1) a distance between two of the second MTJ stacks proximate to each other; (2) a distance between the second MTJ stack and a metal interconnect of a first metal layer and a second metal layer; (3) a distance between outer edges of the second MTJ stack and respective outer edges of the first metal layer; (4) a distance between the second MTJ stack and the first metal layer; (5) a prohibition against the second MTJ stack interacting with two or more of the first metal layers having different electrical potential; (6) a distance between two of the first metal layers each with a different electrical potential proximate to each other; (7) a distance between a MTJ stack of the MTJ structure and the second MTJ stack; (8) a distance between outer edges of the second MTJ stack and respective outer edges of the second metal layer; (9) a distance between the second MTJ stack and the second metal layer; (10) a distance between two of the second metal layers each with a different electrical potential proximate to each other; (11) a distance between the second MTJ stack and both a second metal layer of a first electrical potential and a second metal layer of a second opposite electrical potential; and (12) a distance between the second MTJ stack and an edge of the first metal layer and the second metal layer, wherein the first metal layer and the second metal are overlapping and the first metal layer and the second metal layer have a different electrical potential. Another aspect includes the distance of the second minimum space and distance rules and the distance of third minimum space and distance rules being potentially different and the distance of the second minimum space and distance rules being potentially less than the distance of the third minimum space and distance rules.

A further aspect of the present disclosure is a method including: forming a first metal layer in a substrate having a first region and a second region; forming a first LK SiCOH layer over the substrate; forming a bottom electrode through a portion of the first LK SiCOH layer over the first metal layer in the first region; forming a first MTJ stack over the bottom electrode in the first region and a second MTJ stack over the first LK SiCOH layer in the second region; forming a second LK SiCOH layer over the substrate; forming a top electrode through a portion of the second LK SiCOH layer over the first MTJ stack; forming a third LK SiCOH layer over the substrate; forming a second metal layer through respective portions of the third LK SiCOH layer over the top electrode in the first region and over the substrate in the second region; and forming a capping layer over the substrate.

Aspects of the present disclosure include forming a second capping layer over the substrate prior to forming the bottom electrode; forming the bottom electrode through a portion of the second capping layer prior to forming the first MTJ stack and the second MTJ stack; forming a third metal layer over the first MTJ stack prior to forming the top electrode; and forming an encapsulation layer over a portion of the first LK SiCOH layer, a portion of the bottom electrode, and along sidewalls of each of the first MTJ stack and the second MTJ stack and the third metal layer prior to forming the top electrode. Other aspects include locating the first MTJ in the first region based on: (1) a distance between two top electrodes and two bottom electrodes proximate to each other, respectively; (2) a distance between outer edges of the bottom electrode and the top electrode and respective outer edges of the first metal layer and the second metal layer; (3) a distance between outer edges of the first MTJ stack and respective outer edges of the top electrode and the bottom electrode; (4) a distance between the top electrode and the bottom electrode and a metal interconnect of a first metal layer and a second metal layer; (5) a distance away from BEOL VNCAP and IND regions within the substrate; and (6) a distance away from LV/DV regions of the substrate. Further aspects include forming the second MTJ stack: (1) over the first metal layer; (2) under the second metal layer; (3) over the first metal layer and under the second metal layer; and/or (4) between and proximate the first metal layer and the second metal layer. Another aspect includes locating the second MTJ stack in the second region based on: (1) a distance between two second MTJ stacks proximate to each other; (2) a distance between the second MTJ stack and a metal interconnect of a first metal layer and a second metal layer; (3) a distance between outer edges of the second MTJ stack and respective outer edges of the first metal layer; (4) a distance between the second MTJ stack and a first metal layer; (5) a prohibition against the second MTJ stack interacting with two or more of the first metal layers having different electrical potential; (6) a distance between two first metal layers in the second region each with a different electrical potential proximate to each other; (7) a distance between a first MTJ stack and a second MTJ stack; (8) a distance between outer edges of the second MTJ stack and respective outer edges of the second metal layer; (9) a distance between the second MTJ stack and a second metal layer; (10) a distance between two second metal layers in the second region each with a different electrical potential proximate to each other; (11) a distance between the second MTJ stack and both a second metal layer of a first electrical potential and a second metal layer of a second opposite electrical potential; and (12) a distance between the second MTJ stack and an edge of the first metal layer and the second metal layer, wherein the first metal layer and the second metal are overlapping and the first metal layer and the second metal layer have a different electrical potential.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A and 2B through 13A and 13B, respectively, schematically illustrate cross-sectional views of a process flow for forming a standard MTJ stack and a high-density or a low-density MTJ dummy stack structure in an embedded MRAM layout, in accordance with an exemplary embodiment;

FIGS. 14A, 14B, and 14C, schematically illustrate alternate cross-sectional views of FIG. 13B, in accordance with an exemplary embodiment;

FIGS. 15A and 15B, schematically illustrate a cross-sectional view and a top view, respectively, of a MTJ stack fill scheme, in accordance with an exemplary embodiment; and FIGS. 16A and 16B through 16E schematically illustrate a cross-section view and top views, respectively, of a high-density or a low-density MTJ dummy structure fill scheme, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of wasted MRAM cell space, lacking suitability for both standard and embedded MRAM cell technology, and an inability to meet MTJ density requirements, especially inside the near-active-MRAM-cell periphery logic region attendant upon producing embedded MRAM technology. The problems are solved, inter alia, by forming different density MTJ dummy fill in near-active-MRAM-cell periphery and far-outside-MRAM logic regions to produce a MTJ dummy fill gradient decreasing in density from an MRAM cell towards the outer logic regions.

Methodology in accordance with embodiments of the present disclosure includes providing an embedded MRAM layout with a near-active-MRAM-cell periphery logic region and a far-outside-MRAM logic region. A MTJ structure is formed within the layout based on first minimum space and distance rules relative to a first metal layer, a second metal layer, and/or both the first metal layer and the second metal layer. A high-density MTJ dummy structure is formed in the near-active-MRAM-cell periphery logic region without a top electrode or a bottom electrode based on second minimum space and distance rules relative to a first metal layer, a second metal layer, and/or both the first metal layer and the second metal layer; and a low-density MTJ dummy structure is formed in the far-outside-MRAM logic region without a top electrode or a bottom electrode based on third minimum space and distance rules relative to a first metal layer, a second metal layer, and/or both the first metal layer and the second metal layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
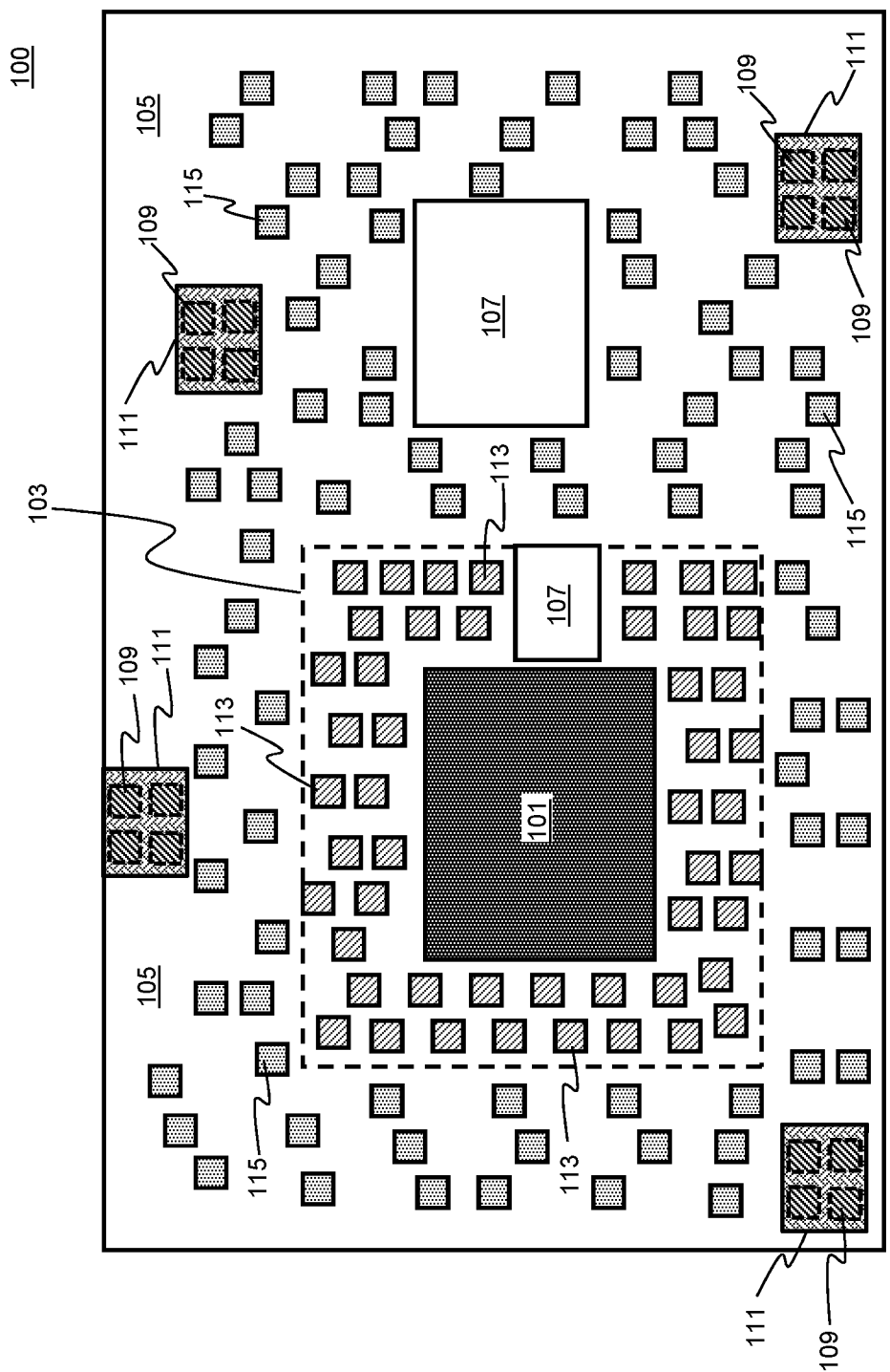
FIG. 1 schematically illustrates a high-level top view of a MTJ dummy fill gradient scheme across near-active-MRAM-cell periphery and far-outside-MRAM logic regions, in accordance with an exemplary embodiment.

FIG. 1 schematically illustrates a high-level top view of a MTJ dummy fill gradient scheme across near-active-MRAM-cell periphery and far-outside-MRAM logic regions, in accordance with an exemplary embodiment. Referring to FIG. 1, a MRAM layout or scheme 100 is provided with an MRAM cell 101, a near-active-MRAM-cell periphery logic region, as delineated by the box 103, a far-outside-MRAM logic region 105, and logic devices 107. Standard MTJ structures 109 may be formed anywhere within the layout 100; however, they are rarely generated inside of the near-active-MRAM-cell periphery logic region 103 due to tight metal routing. In this instance, four MTJ structures 109 are formed together and the location of each MTJ structure 109 within the layout 100 is determined based on minimum space and distance rules relative to a first metal layer or first metal line region (1x) (not shown for illustrative convenience), a second metal layer or second metal line region 111 (2x), and/or both the first metal layer and the second metal layer 111, as discussed in greater detail with respect to FIGS. 15A and 15B.

A high-density MTJ dummy stack structure 113 and/or a low-density MTJ dummy stack structure 115 is formed in the near near-active-MRAM-cell periphery logic region 103 or the far-outside-MRAM logic region 105, respectively. Similar to the MTJ structures 109, the high-density MTJ dummy stack structure 113 and the low-density MTJ dummy stack structure 115 are formed based on minimum space and distance rules relative to a first metal layer or first metal line region (1x), a second metal layer or second metal line region 111 (2x), and/or both the first metal layer and the second metal layer 111, as discussed in greater detail with respect to FIGS. 16A through 16E. Generally, more aggressive density rules are adopted for the high-density MTJ dummy stack structures 113 to ensure a higher MTJ density in the near-active-MRAM-cell periphery logic region 103, which can help to provide a more planarized surface and a uniform magnetic field cell close to the MRAM 101, and relatively relaxed density rules are adopted for the far-outside-MRAM logic region 105 to prevent increasing the overall MRAM cell size relative to known solutions.

FIGS. 2A and 2B through 13A and 13B, respectively, illustrate cross-sectional views of a process flow for forming a standard MTJ stack (FIGS. 2A through 13A) and a high-density or a low-density MTJ dummy stack structure (FIGS. 2B through 13B) in an embedded MRAM layout and FIGS. 14A, 14B, and 14C schematically illustrate alternate cross-sectional views of FIG. 13B, in accordance with an exemplary embodiment. Referring to FIGS. 2A and 2B, a metal layer 201 (1x) is formed, e.g., of copper (Cu), in a substrate 203, e.g., formed of a ULK layer, having a near-active-MRAM-cell periphery logic region and a far-outside-MRAM logic region (both not shown for illustrative convenience). A capping layer 205 is formed, e.g., of Nblok, over the substrate 203. Thereafter, a LK SiCOH layer 207 is formed over the capping layer 205.

Next, a trench 301 is formed with a width and a length of 0.15 through the LK SiCOH layer 207 and the capping layer 205 of FIG. 2A, forming the LK SiCOH layer 207' and the capping layer 205', as depicted in FIGS. 3A and 3B. Referring to FIGS. 4A and 4B, a metal layer (not shown for illustrative convenience) is formed, e.g., of tantalum nitride (TaN), over the substrate 203 and completely filling in the trench 301. The metal layer is then planarized, e.g., by chemical mechanical polishing (CMP), down to the LK SiCOH layer 207', forming a bottom electrode (BE) 401. Referring to FIGS. 5A and 5B, a standard MTJ stack 501 and a metal layer 503, e.g., formed of TaN, are formed over the substrate 203 and then a hardmask 505 is formed, e.g., of oxide, over a portion of the metal layer 503.

Figure 6A:
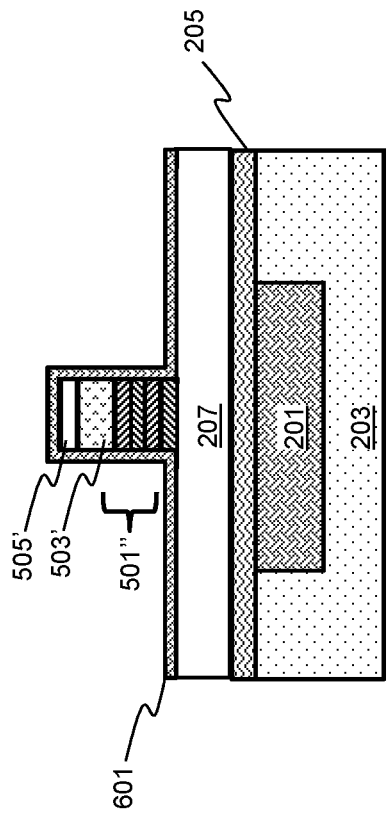
Figure 6B:
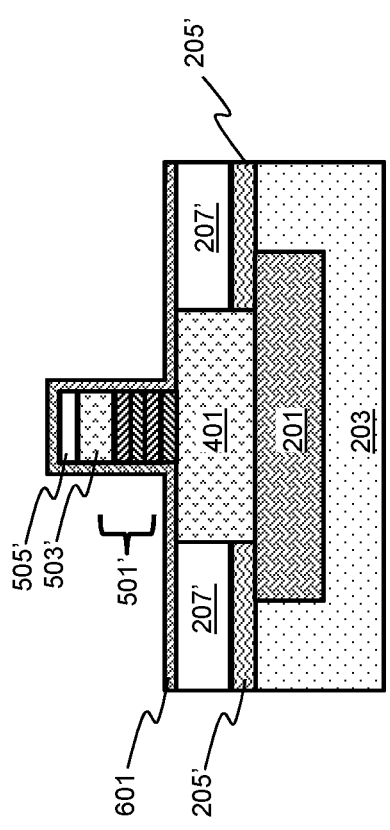

Referring to FIGS. 6A and 6B, the hardmask 505, the metal layer 503, and the MTJ stack 501 are etched down to the LK SiCOH layers 207' and 207, respectively, forming the hardmask 505', the metal layer 503', the MTJ stack 501' with a width and a length of 0.12 µm, and the MTJ stack 501" having a width greater than or equal to 0.11 µm. In this instance, the MTJ stack 501' represents a MTJ stack 109 of FIG. 1 and the MTJ stack 501" represents a high-density MTJ dummy structure 113 and/or a low-density MTJ dummy structure 115 of FIG. 1. An encapsulation layer 601 is then formed, e.g., of silicon nitride (SiN), over the substrate 203.

Figure 7A:
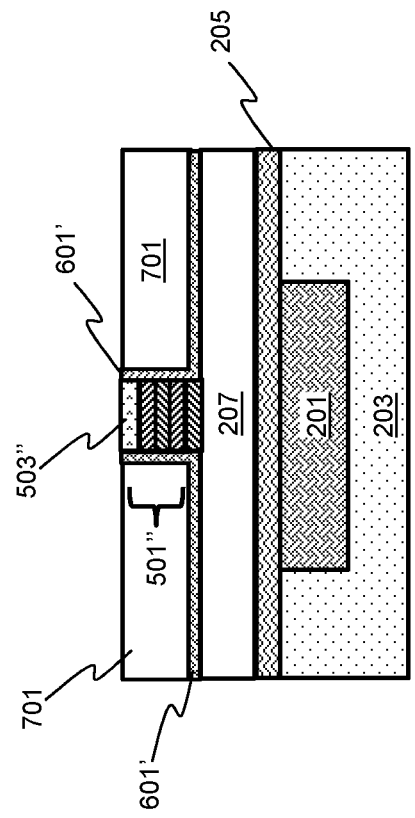
Figure 7B:
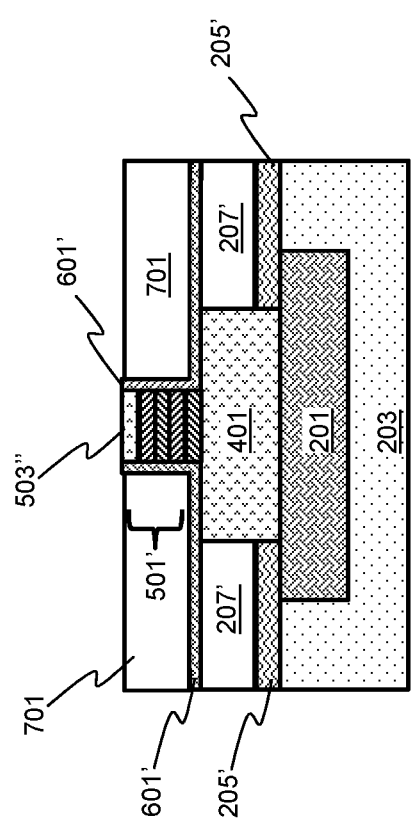
Figure 8B:
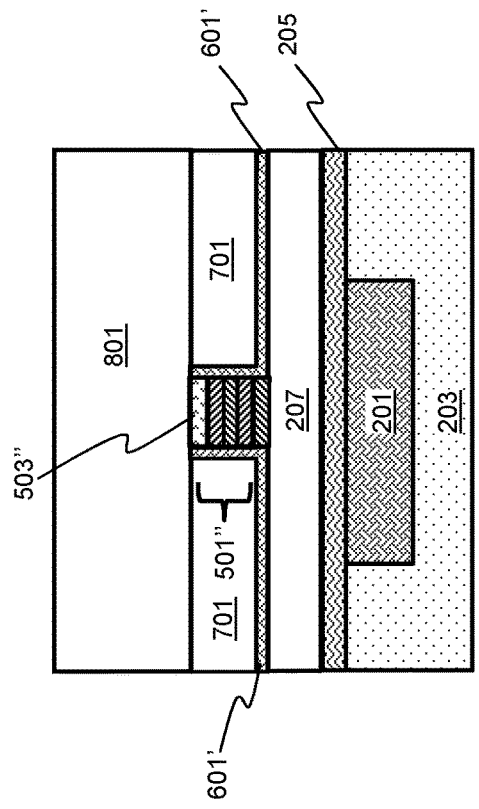
Figure 8A:
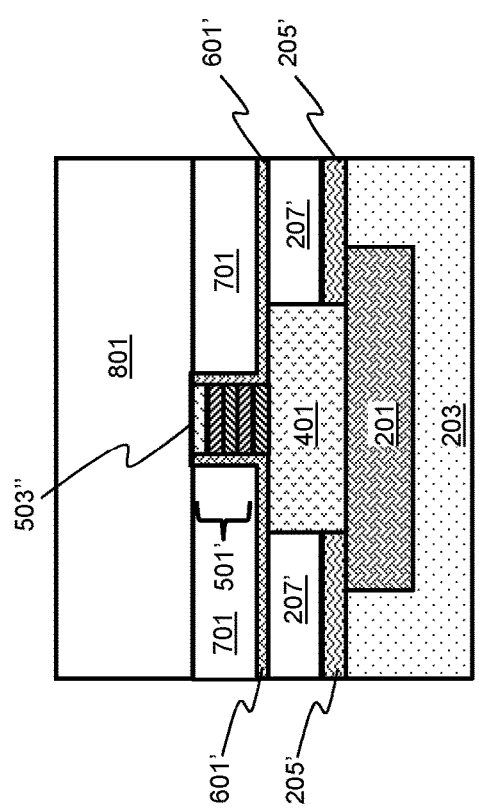
Figure 9B:
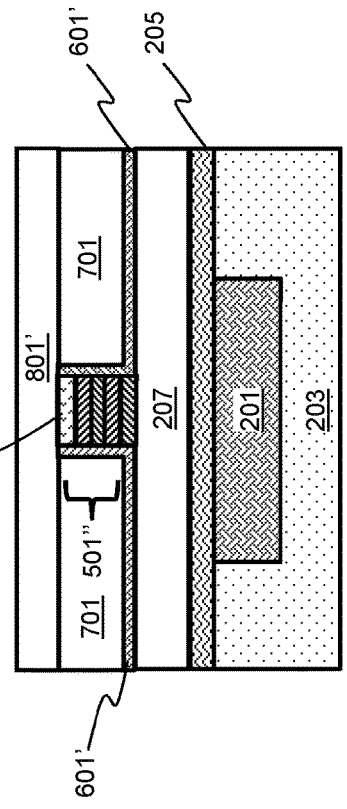
Figure 9A:
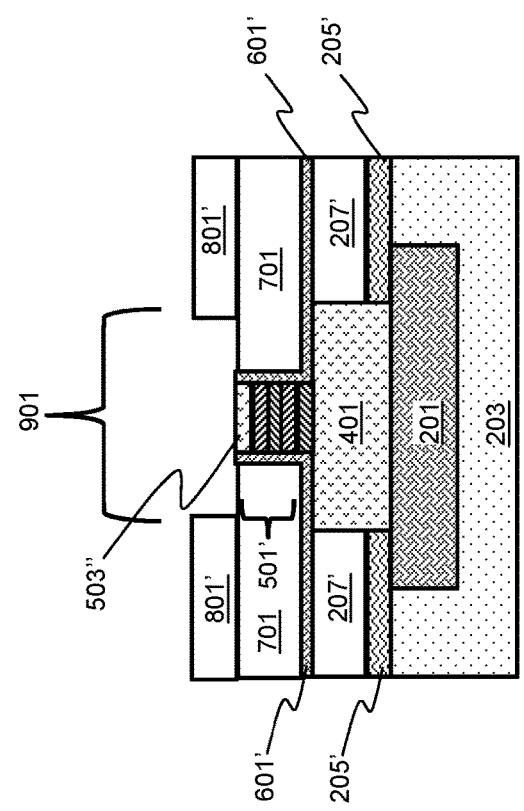

Next, a LK SiCOH layer (not shown for illustrative convenience) is formed over the substrate 203 and then planarized, e.g., by CMP, forming the LK SiCOH layer 701, the metal layer 503", and the encapsulation layer 601', as depicted in FIGS. 7A and 7B. Referring to FIGS. 8A and 8B, a LK SiCOH layer 801 is formed over the substrate 203. Subsequently, a trench 901 is formed with a width and a length of 0.15 µm through the LK SiCOH layer 801 of FIG. 9A down to the metal layer 503" and the LK SiCOH layer 801 is planarized, e.g., by CMP, forming the LK SiCOH layer 801', as depicted in FIGS. 9A and 9B.

Referring to FIGS. 10A and 10B, a metal layer (not shown for illustrative convenience) is formed, e.g., of TaN, over the substrate 203 of FIG. 10A and then planarized, e.g., by CMP, down to the LK SiCOH layer 801', forming the top electrode (TE) 1001. Next, a LK SiCOH layer 1101 is formed over the substrate 203 and a hardmask 1103 is formed, e.g., of tetraethyl orthosilicate (TEOS), over the LK SiCOH layer 1101, as depicted in FIGS. 11A and 11B. Referring to FIGS. 12A and 12B, a trench 1201 is formed through the hardmask 1103 and the LK SiCOH layer 1101 down to the TE 1001, forming the hardmask 1103' and the LK SiCOH layer 1101'.

Next, the hardmask 1103' is stripped, a metal layer (not shown for illustrative convenience) is formed, e.g., of Cu, over the substrate 203 and completely filling in the trench 1201, and then the metal layer is planarized, e.g., by CMP, forming the metal layer 1301. Thereafter, a capping layer 1303 is formed over the substrate 203. In this instance, the MTJ stack 501" is depicted as being formed above the metal layer 201 and below the metal layer 1301; however, the MTJ stack 501" could also be formed over only the metal layer 201; only under the metal layer 1301; and/or between and proximate to the metal layers 201 and 1301, as depicted in FIGS. 14A, 14B, and 14C, respectively. The particular location of the MTJ stacks 501' and 501" relative to the metal layer 201, the metal layer 1301, and/or the metal layers 201 and 1301 of the MRAM layout 100 depends on respective minimum space and distance rules as discussed more fully with respect to FIGS. 15A and 15B and FIGS. 16A through 16E, respectively.

FIGS. 15A and 15B, schematically illustrate a cross-sectional view and a top view, respectively, of a MTJ stack fill scheme, in accordance with an exemplary embodiment. As discussed briefly with respect to FIG. 1 and following the process flow as described with respect to FIGS. 2A through 13A, the location of each standard MTJ stack 109 (501'), TE 1001, and BE 401 within the layout 100 is based on minimum space and distance rules relative to a metal layer 201, a metal layer 111 (1301), and/or both the metal layers 201 and 111 (1301).

Specifically, the location of the MTJ stack 501' (109) within the MRAM layout 100 is determined based on the following guidelines: (1) a distance between two TE 1001 and BE 401 that are proximate to each other, e.g., a minimum space greater than or equal to 0.1 µm, as depicted by the arrow 1501; (2) a distance between outer edges of the BE 401 and the TE 1001 and respective outer edges of the metal layers 201 and 1301, e.g., must be within a distance greater than or equal to 0.025 µm, as depicted by the arrows 1503; (3) a distance between outer edges of the MTJ stack 501' and respective outer edges of the TE 1001 and the BE 401, e.g., must be within a distance greater than or equal to 0.15 µm, as depicted by the arrow 1505; and (4) a distance between the TE 1001 and the BE 401 and a metal interconnect 1507 between a metal layer 201 and a metal layer 1301, e.g., a minimum space greater than or equal to 0.625 µm, as depicted by the arrow 1509. In addition, the MTJ stack 501' must be kept a distance from the BEOL VNCAP and IND regions of the layout 100 (not shown for illustrative convenience), e.g., a distance greater than or equal to 0.625 µm, and a distance from the LV/DV regions of the layout 100 (not shown for illustrative convenience), e.g., a distance greater than or equal to 2 µm.

FIGS. 16A and 16B through 16E schematically illustrate a cross-section view and top views, respectively, of a high-density or a low-density MTJ dummy structure fill scheme, in accordance with an exemplary embodiment. In particular, FIGS. 16B, 16C, 16D, and 16E schematically illustrate a top view of the relationship between a high-density or a low-density MTJ dummy structure and the 1x metal layer, the 2x metal layer, the 1x and 2x metal layers each with a different electrical potential, and the 1x and 2x metal layers each with the same electrical potential, respectively.

Again, as briefly discussed with respect to FIG. 1 and following the process flow as described with respect to FIGS. 2B through 13B and FIGS. 14A, 14B, and 14C, the location of each high-density MTJ dummy stack structure 113 (501") and/or each low-density MTJ dummy stack structure 115 (501") in the near near-active-MRAM-cell periphery logic region 103 or the far-outside-MRAM logic region 105 (not shown for illustrative convenience) is based on minimum space and distance rules relative to a metal layer 201, a metal layer 1301, and/or both the metal layers 201 and 1301.

Figure 16C:
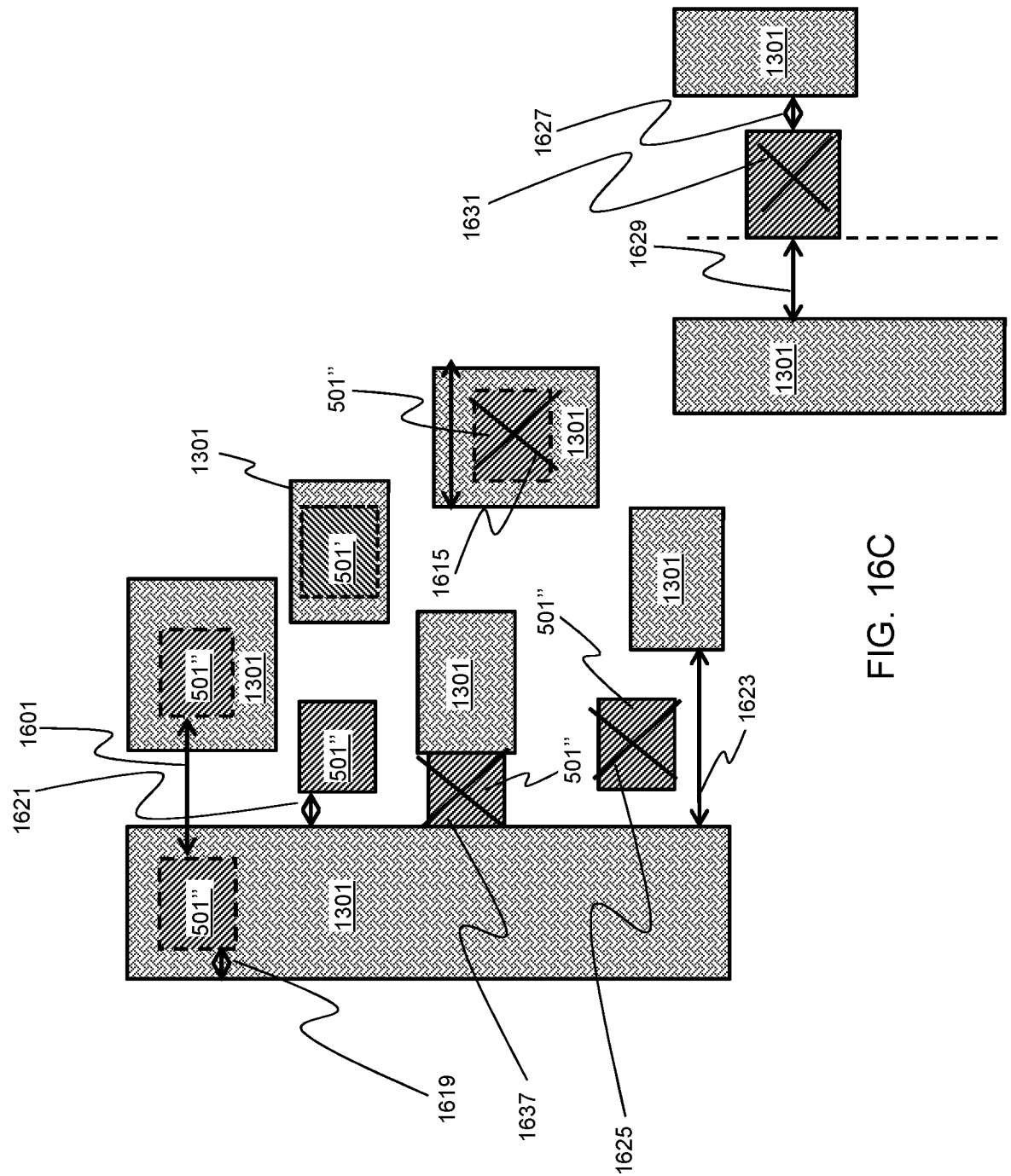

Specifically, the location of the MTJ stack 501" (113/115) within the MRAM layout 100 is determined based on the following guidelines: (1) a distance between two MTJ stacks 501" proximate to each other, e.g., a minimum space greater than or equal to 0.13 µm, as depicted by the arrow 1601; (2) a distance between the MTJ stack 501" and a metal interconnect 1603 of a metal layer 201 and a metal layer 1301, e.g., a minimum space greater than or equal to 0.4 µm, as depicted by the arrow 1605; (3) a distance between outer edges of the MTJ stack 501" and respective outer edges of the metal layer 201, e.g., must be within a distance greater than or equal to 0.3 µm, as depicted by the arrow 1607; (4) a distance between the MTJ stack 501" and a metal layer 201, e.g., a minimum space greater than or equal to 0.3 µm, as depicted by the arrow 1609; (5) a prohibition against the MTJ stack 501" interacting with two or more metal layers 201/1301 having different electrical potential, as depicted by the "X" 1611; (6) a distance between two metal layers 201 each with a different electrical potential proximate to each other, e.g., a MTJ stack 501" cannot fill in the facing spacing regions of metal layers 201 of different electrical potential with a spacing smaller than 0.18 µm, as depicted by the arrow 1613 and the "X" 1615; (6) a distance between a MTJ stack 501' and a MTJ stack 501", e.g., a minimum space of 0.6 µm, as depicted by the arrow 1617; (7) a distance between outer edges of the MTJ stack 501" and respective outer edges of the metal layer 1301, e.g., must be within a distance greater than or equal to 0.5 µm, as depicted by the arrows 1619 (FIGS. 16A and 16C); (8) a distance between the MTJ stack 501" and the metal layer 1301, e.g., a minimum space greater than or equal to 0.5 µm, as depicted by the arrow 1621 (FIG. 16C); (9) a distance between two metal layers 1301 each with a different electrical potential proximate to each other, e.g., a MTJ stack 501" cannot fill in the facing spacing regions of metal layers 1301 of different electrical potential with spacing smaller than 0.21 µm, as depicted by the arrow 1623 and the "X" 1625; (10) a distance between the MTJ stack 501" and both a metal layer 1301 of a first electrical potential and a metal layer 1301 of a second opposite electrical potential, e.g., if a distance between the MTJ stack 501" and the metal layer 1301 of a different electrical potential is less than or equal to 0.02 µm, then the space to another facing metal layer 1301 of a different electrical potential should be greater than or equal to 0.05 µm, as depicted by the arrows 1627 and 1629, respectively, and the "X" 1631; (11) a distance between the MTJ stack 501" and an edge of the metal layers 201 and 1301, wherein the metal layers 201 and 1301 are overlapping (common) and the metal layers 201 and 1301 have a different electrical potential, e.g., a minimum space to common regions at different electrical potential greater than or equal to 0.03 µm, as depicted by the arrows 1633 and the "X" 1635 (FIG. 16D); and (12) the MTJ stack 501" must not interact with two or more metal layers 1301 of different electrical potential, as depicted by the "X" 1637 (FIG. 16C).

Figure 16D:
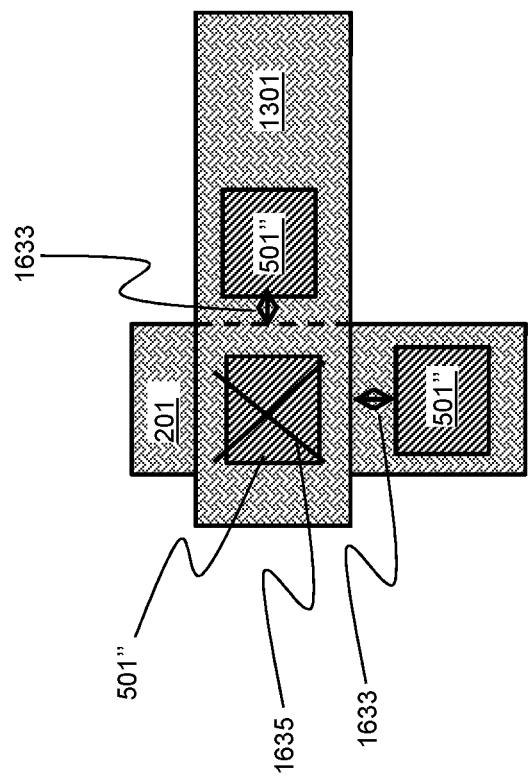
Figure 16E:
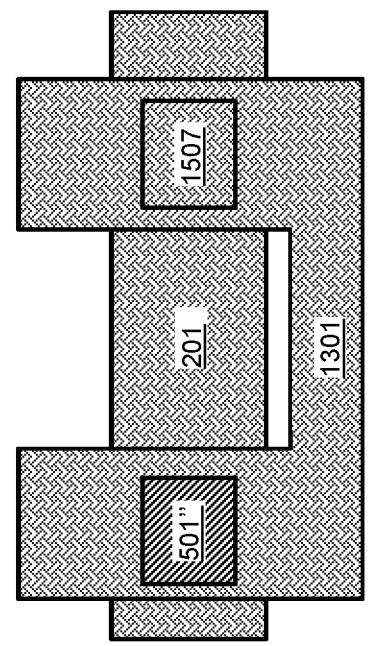

Referring to FIGS. 16D and 16E, whereas the MTJ stack 501" is not permitted within the overlapping region of the metal layers 201 and 1301 in FIG. 16D, as depicted by the "X" 1635, the MTJ stack 501" is permitted in the overlapping region of the metal layers 201 and 1301 in FIG. 16E because the metal layers 201 and 1301 have the same electrical potential due to the metal interconnect 1507. Further, the minimum space and distance rules described above may be different for the near-active-MRAM periphery logic region 103 and the far-outside-MRAM logic region 105 and the distances may be less for the near-active-MRAM periphery logic region 103 than for the far-outside-MRAM logic region 105.

The embodiments of the present disclosure can achieve several technical effects including generating a high-density MTJ dummy fill scheme in the near-active-MRAM periphery logic region to provide a more planarized surface for "dishing" concern and a uniform magnetic field as well as generating a low-density MTJ dummy fill scheme in the far-outside-MRAM logic region to help reduce the capacitance while still serving to prevent CMP "dishing." In addition, the MTJ dummy fill gradient achieves a more planarized surface and uniform magnetic field relative to known solutions without increasing the MRAM cell dimension relative to known solutions or requiring additional masks. Further, forming each MTJ dummy structure without a TE/BE does not add parasitic capacitance to the metal routing. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including embedded MRAM.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   an ultra-low k (ULK) layer with a near-active-magnetoresistive random access memory (MRAM)-cell periphery logic region and a far-outside-MRAM logic region;
   a first metal layer within portions of the ULK layer;
   a first capping layer over a portion of the ULK layer and a portion of the first metal layer;
   a first low-k hydrogenated oxidized silicon carbon (LK SiCOH) layer over the first capping layer;
   a magnetic tunnel junction (MTJ) structure over the first metal layer;
   a high-density MTJ dummy structure without a top electrode or a bottom electrode over the first LK SiCOH layer in the near-active-MRAM-cell periphery logic region;
   a low-density MTJ dummy structure without a top electrode or a bottom electrode over the first LK SiCOH layer in the far-outside-MRAM logic region;
   a second LK SiCOH layer over a portion of the ULK layer;
   a second metal layer within portions of the second LK SiCOH layer; and
   a second capping layer over the ULK layer,
   wherein a location of each of the MTJ structure, the high-density MTJ dummy structure, and the low-density MTJ dummy structure is based on first minimum space and distance rules, second minimum space and distance rules, and third minimum space and distance rules, respectively, relative to the first metal layer, the second metal layer, or both the first metal layer and the second metal layer.

2. The device according to claim 1, further comprising:
   back-end-of-line (BEOL) capacitance (VNCAP) and inductor (IND) regions; and
   C4 bumping (LV)/wirebond (DV) regions,
   wherein the MTJ structure is located a distance away from the VNCAP and IND regions and a distance away from the LV/DV regions.

3. The device according to claim 1, further comprising:
   a bottom electrode having a width and a length of 0.15 micrometer (µm) over the first metal layer;
   a MTJ stack having a width of 0.12 µm over a portion of the bottom electrode;
   a top electrode having a width and a length of 0.15 µm over the MTJ stack
   wherein the MTJ structure comprises the bottom electrode, the MTJ stack, and the top electrode.

4. The device according to claim 3, wherein the first minimum space and distance rules comprise: (1) a distance between two of the top electrodes and two of the bottom electrodes proximate to each other, respectively; (2) a distance between outer edges of the bottom electrode and the top electrode and respective outer edges of the first metal layer and the second metal layer; (3) a distance between outer edges of the MTJ stack and respective outer edges of the top electrode and the bottom electrode; and (4) a distance between the top electrode and the bottom electrode and a metal interconnect of the first metal layer and the second metal layer.

5. The device according to claim 3, further comprising:
   a third capping layer over a remaining portion of the first metal layer;
   a third LK SiCOH layer over the third capping layer;
   a second MTJ stack: (1) over the first metal layer; (2) under the second metal layer; (3) over the first metal layer and under the second metal layer; or (4) between and proximate the first metal layer and the second metal layer; and
   a fourth LK SiCOH layer over a remaining portion of the ULK layer;
   wherein the high-density MTJ dummy structure and the low-density MTJ dummy structure comprise the second MTJ stack.

6. The device according to claim 5, further comprising:
   a third metal layer over the MTJ structure, the high-density MTJ dummy structure, and the low-density MTJ dummy structure.

7. The device according to claim 6, further comprising:
   an encapsulation layer over the first LK SiCOH layer, a portion of the bottom electrode, and along sidewalls of the MTJ stack, the second MTJ stack, and the third metal layer, respectively.

8. The device according to claim 5, wherein the second minimum space and distance rules and the third minimum space and distance rules each comprise: (1) a distance between two of the second MTJ stacks proximate to each other; (2) a distance between the second MTJ stack and a metal interconnect of the first metal layer and the second metal layer; (3) a distance between outer edges of the second MTJ stack and respective outer edges of the first metal layer; (4) a distance between the second MTJ stack and the first metal layer; (5) a prohibition against the second MTJ stack interacting with two or more of the first metal layers having different electrical potential; (6) a distance between two of the first metal layers each with a different electrical potential proximate to each other; (7) a distance between a MTJ stack of the MTJ structure and the second MTJ stack; (8) a distance between outer edges of the second MTJ stack and respective outer edges of the second metal layer; (9) a distance between the second MTJ stack and the second metal layer; (10) a distance between two of the second metal layers each with a different electrical potential proximate to each other; (11) a distance between the second MTJ stack and both a second metal layer of a first electrical potential and a second metal layer of a second opposite electrical potential; and (12) a distance between the second MTJ stack and an edge of the first metal layer and the second metal layer, wherein the first metal layer and the second metal are overlapping and the first metal layer and the second metal layer comprise a different electrical potential.

9. The device according to claim 8, wherein the distance of the second minimum space and distance rules and the distance of third minimum space and distance rules may be different and the distance of the second minimum space and distance rules may be less than the distance of the third minimum space and distance rules.

10. A device comprising:
    an ultra-low k (ULK) layer with a near-active-magnetoresistive random access memory (MRAM)-cell periphery logic region and a far-outside-MRAM logic region;
    a first metal layer within portions of the ULK layer;
    a first capping layer over a portion of the ULK layer and a portion of the first metal layer;
    a first low-k hydrogenated oxidized silicon carbon (LK SiCOH) layer over the first capping layer;
    a magnetic tunnel junction (MTJ) structure over the first metal layer;

a high-density MTJ dummy structure without a top electrode or a bottom electrode over the first LK SiCOH layer in the near-active-MRAM-cell periphery logic region;

a low-density MTJ dummy structure without a top electrode or a bottom electrode over the first LK SiCOH layer in the far-outside-MRAM logic region;

a second LK SiCOH layer over a portion of the ULK layer;

a second metal layer within portions of the second LK SiCOH layer; and a second capping layer over the ULK layer, wherein a location of the MTJ structure is based on a distance away from back-end-of-line (BEOL) capacitance (VNCAP) and inductor (IND) regions within a layout and a distance away from C4 bumping (LV)/wirebond (DV) regions of the layout.

11. The device according to claim 10, wherein a location of each of the MTJ structure, the high-density MTJ dummy structure, and the low-density MTJ dummy structure is based on first minimum space and distance rules, second minimum space and distance rules, and third minimum space and distance rules, respectively, relative to the first metal layer, the second metal layer, and at least one of the first metal layer or the second metal layer.

12. The device according to claim 11, wherein the first minimum space and distance rules comprise: (1) a distance between two of the top electrodes and two of the bottom electrodes proximate to each other, respectively; (2) a distance between outer edges of the bottom electrode and the top electrode and respective outer edges of the first metal layer and the second metal layer; (3) a distance between outer edges of the MTJ stack and respective outer edges of the top electrode and the bottom electrode; and (4) a distance between the top electrode and the bottom electrode and a metal interconnect of the first metal layer and the second metal layer.

13. The device according to claim 10, further comprising:
a bottom electrode having a width and a length of 0.15 micrometer (μm) over the first metal layer;
a MTJ stack having a width of 0.12 μm over a portion of the bottom electrode;
a top electrode having a width and a length of 0.15 μm over the MTJ stack.

14. The device according to claim 13, wherein the MTJ structure comprises the bottom electrode, the MTJ stack, and the top electrode.

15. The device according to claim 14, further comprising:
a third capping layer over a remaining portion of the first metal layer;
a third LK SiCOH layer over the third capping layer;
a second MTJ stack: (1) over the first metal layer; (2) under a second metal layer; (3) over the first metal layer and under the second metal layer; or (4) between and proximate the first metal layer and the second metal layer; and
a fourth LK SiCOH layer over a remaining portion of the ULK layer.

16. The device according to claim 15, wherein the high-density MTJ dummy structure and the low-density MTJ dummy structure comprise the second MTJ stack.

17. The device according to claim 15, further comprising:
a third metal layer over the MTJ structure, the high-density MTJ dummy structure, and the low-density MTJ dummy structure.

18. The device according to claim 17, further comprising:
an encapsulation layer over the first LK SiCOH layer, a portion of the bottom electrode, and along sidewalls of the MTJ stack, the second MTJ stack, and the third metal layer, respectively.

19. A device comprising:
an ultra-low k (ULK) layer with a near-active-magnetoresistive random access memory (MRAM)-cell periphery logic region and a far-outside-MRAM logic region,
a first metal layer within portions of the ULK layer;
a first capping layer over a portion of the ULK layer and a portion of the first metal layer;
a first low-k hydrogenated oxidized silicon carbon (LK SiCOH) layer over the first capping layer;
a magnetic tunnel junction (MTJ) structure over the first metal layer;
a high-density MTJ dummy structure without a top electrode or a bottom electrode over the first LK SiCOH layer in the near-active-MRAM-cell periphery logic region;
a low-density MTJ dummy structure without a top electrode or a bottom electrode over the first LK SiCOH layer in the far-outside-MRAM logic region;
a second LK SiCOH layer over a portion of the ULK layer;
a second metal layer within portions of the second LK SiCOH layer; and
a second capping layer over the ULK layer.

* * * * *